United States Patent
Lin et al.

(10) Patent No.: US 12,362,003 B2
(45) Date of Patent: *Jul. 15, 2025

(54) IN-MEMORY COMPUTATION DEVICE AND IN-MEMORY COMPUTATION METHOD TO PERFORM MULTIPLICATION OPERATION IN MEMORY CELL ARRAY ACCORDING TO BIT ORDERS

(71) Applicant: MACRONIX International Co., Ltd., Hsinchu (TW)

(72) Inventors: Yu-Hsuan Lin, Taichung (TW); Po-Hao Tseng, Taichung (TW); Feng-Min Lee, Hsinchu (TW); Ming-Hsiu Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 295 days.

This patent is subject to a terminal disclaimer.

(21) Appl. No.: 18/303,194

(22) Filed: Apr. 19, 2023

(65) Prior Publication Data
US 2023/0253032 A1 Aug. 10, 2023

Related U.S. Application Data

(63) Continuation of application No. 17/344,555, filed on Jun. 10, 2021, now Pat. No. 11,664,070.
(Continued)

(51) Int. Cl.
| | |
|---|---|
| G11C 11/4093 | (2006.01) |
| G06F 7/501 | (2006.01) |
| G06F 7/523 | (2006.01) |
| G11C 11/408 | (2006.01) |
| G11C 11/4091 | (2006.01) |
| G11C 11/4094 | (2006.01) |

(52) U.S. Cl.
CPC ......... *G11C 11/4093* (2013.01); *G06F 7/501* (2013.01); *G06F 7/523* (2013.01); *G11C 11/4085* (2013.01); *G11C 11/4091* (2013.01); *G11C 11/4094* (2013.01)

(58) Field of Classification Search
CPC ............ G11C 11/4093; G11C 11/4085; G11C 11/4091; G11C 11/4094
USPC .................................................... 365/189.06
See application file for complete search history.

(56) References Cited

U.S. PATENT DOCUMENTS

| | | | | |
|---|---|---|---|---|
| 11,664,070 B2* | 5/2023 | Lin | ...................... | G06F 7/5443 |
| | | | | 365/189.05 |
| 2024/0257865 A1* | 8/2024 | Fujiwara | ............... | G06F 7/5443 |
| 2024/0303037 A1* | 9/2024 | Castro | ..................... | G06F 7/523 |

* cited by examiner

*Primary Examiner* — Connie C Yoha
(74) *Attorney, Agent, or Firm* — J.C. PATENTS

(57) ABSTRACT

An in-memory computation device and computation method are provided. The in-memory computation method includes: providing a memory cell block of a memory cell array to store a plurality of weight values, and providing a plurality of memory cells on the memory cell block to store a plurality of corresponding bits of each of the weight values; respectively transmitting a plurality of input signals to the plurality of bit lines through an input buffer; providing the plurality of memory cells to perform a multiplication operation of the plurality of input signals and the plurality of weight values to generate a plurality of first operation results respectively corresponding to a plurality of bit orders; and performing an addition operation on the plurality of first operation results to generate a second operation result according to the plurality of bit orders by a sense amplifier.

7 Claims, 12 Drawing Sheets

Related U.S. Application Data

(60) Provisional application No. 63/142,976, filed on Jan. 28, 2021.

IN-MEMORY COMPUTATION DEVICE AND IN-MEMORY COMPUTATION METHOD TO PERFORM MULTIPLICATION OPERATION IN MEMORY CELL ARRAY ACCORDING TO BIT ORDERS

CROSS-REFERENCE TO RELATED APPLICATION

This application is a continuation application of and claims the priority benefit of a prior application Ser. No. 17/344,555, filed on Jun. 10, 2021, which claims the priority benefit of U.S. provisional application Ser. No. 63/142,976, filed on Jan. 28, 2021. The entirety of each of the above-mentioned patent applications is hereby incorporated by reference herein and made a part of this specification.

BACKGROUND

Technical Field

This disclosure relates to relates to an in-memory computation device and a computation method thereof, and in particular to an in-memory computation device that can store a single bit weight value.

Description of Related Art

Artificial intelligence has become a mainstream technology with advancements in technology. In order to enable efficient execution of a multiply-add operation in a neural-like networks, it is important for circuit designers to provide a simple hardware circuit that is capable of executing the multiply-add operation quickly.

In response to this trend, a so-called in-memory computation device is proposed, in which the in-memory computation device uses a memory to serve as a medium for storing weight values, and executes the multiply-add operation according to a received input signal. A large number of the multiply-add operation can be completed with a small circuit area based on high-density characteristics of memory cells in the memory.

SUMMARY

This disclosure provides an in-memory computation device and a computation method thereof, which can complete a multiply-add operation by switching on a portion of word lines.

The in-memory computation device of the disclosure includes a memory cell array, an input buffer, and a sense amplifier. The memory cell array includes a memory cell block. The memory cell block corresponds to at least one word line and is configured to store multiple weight values. Multiple memory cells on the memory cell block store corresponding multiple bits of each of the weight values. The input buffer is coupled to multiple bit lines. The input buffer respectively transmits multiple input signals to the bit lines. The memory cell array enables a multiplication operation of the input signals and the weight values to generate multiple first operation results respectively corresponding to multiple bit orders. The sense amplifier performs an addition operation on the first operation results to generate a second operation result according to the bit orders corresponding to the first operation results.

The in-memory computation method of the disclosure includes: in a memory cell array, providing a memory cell block corresponding to at least one word line to store multiple weight values; providing an input buffer respectively transmits multiple input signals to the bit lines; in the memory cell array, enabling a multiplication operation of the input signals and the weight values to generate multiple first operation results respectively corresponding to multiple bit orders; and, performing an addition operation on the first operation results to generate a second operation result according to the bit orders corresponding to the first operation results.

Based on the above, the in-memory computation device of the disclosure disposes a memory cell block to store the multiple weight values and transmits the multiple input signals to the corresponding bit lines through the input buffer, so as to enable the multiplication operation of the input signals and the weight values. The sense amplifier is configured to sense the operation results of the multiplication operation, and add the operation results according to the corresponding bit order, so as to obtain the operation result of the multiply-add operation.

To make the abovementioned more comprehensible, several embodiments accompanied by drawings are described in detail as follows.

DESCRIPTION OF THE EMBODIMENTS

Figure 1:
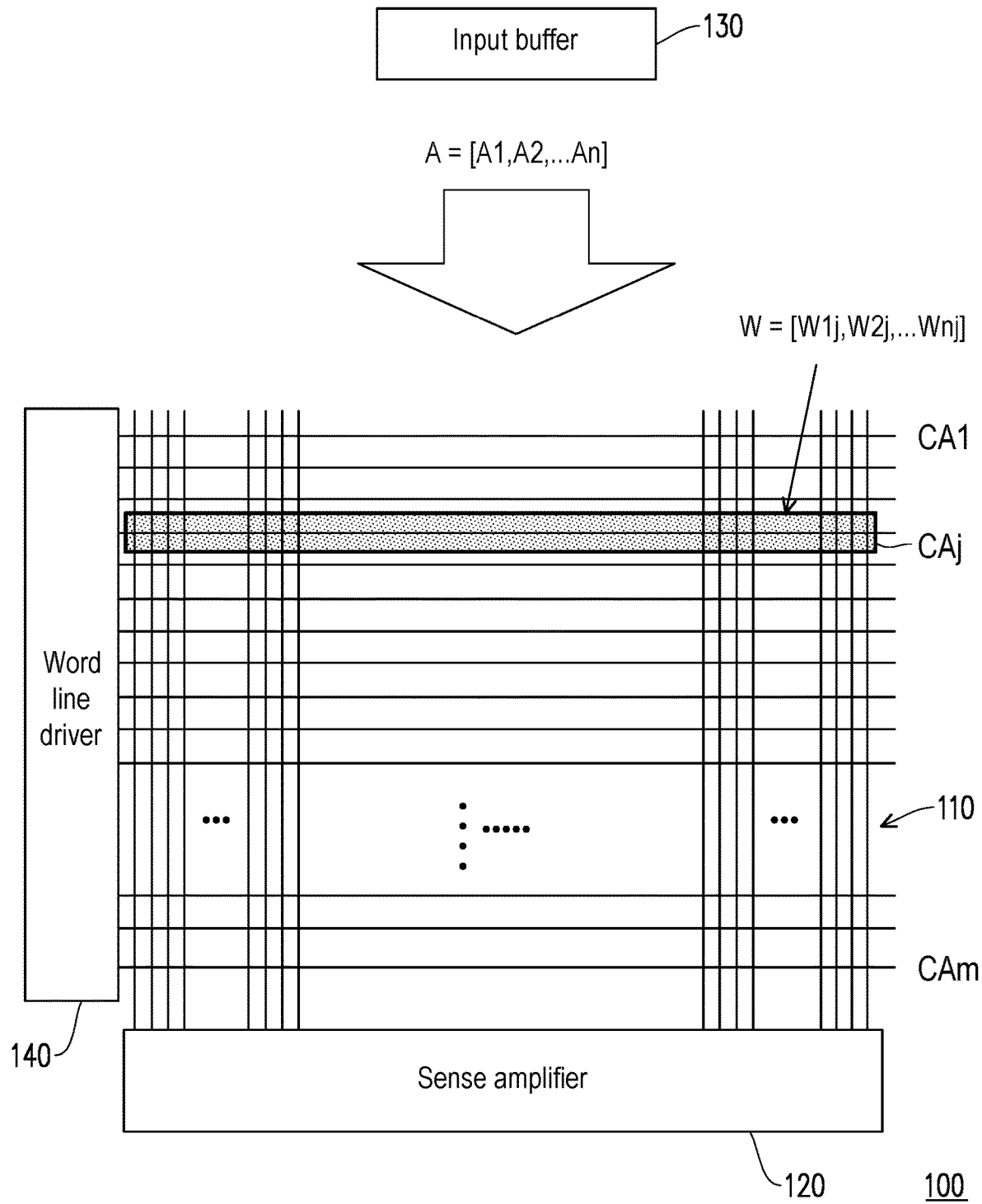
FIG. 1 is a schematic diagram of an in-memory computation device according to an embodiment of the disclosure.

With reference to FIG. 1, FIG. 1 is a schematic diagram of an in-memory computation device according to an embodiment of the disclosure. An in-memory computation device 100 includes a memory cell array 110, an input buffer 130, a sense amplifier 120, and a word line driver 140. There are multiple memory cell blocks CA1 to CAm in the memory cell array 110. Each of the memory cell blocks CA1 to CAm corresponds to one or more word lines. The word line driver 140 is coupled to the word lines and is configured to provide a word line signal to a corresponding word line.

In the embodiment, the memory cell block CAj stores a weight values group W, and the weight values group W includes multiple weight values W1j to Wnj. Each of the weight values W1j to Wnj may have multiple bits and are respectively stored in each memory cell in the memory cell block CAj. Here, the memory cell array 110 of the embodiment may be a reverse flash memory cell array. Each of the memory cells is in the form of a single-level cell (SLC).

The input buffer 130 is coupled to multiple bit lines of the memory cell array 110. An input signals group A is stored in the input buffer 130. The input signals group A includes multiple input signals A1 to An. When the in-memory computation device 100 executes an operation, the input buffer 130 respectively transmits the input signals A1 to An to the bit lines of the memory cell array 110, enables a multiplication operation of multiple bits of the input signals A1 and the multiple weight values W1j to Wnj in the memory cell block CAj, and generates multiple first operation results corresponding to the multiple bit lines.

It should be noted that, taking an example of a multiplication operation of p bits of the input signal A1 and q bits of the weight value W1j (p and q are both positive integers), the memory cell array 110 may generate p×q first operation results (Each of the first operation results is one bit), and the first operation results have a bit order according to its bit value. For example, a first operation result generated by multiplication of a most significant bit of the input signal A1 and a most significant bit of the weight value W1j may have a highest bit order, while a first operation result generated by multiplication of a least significant bit of the input signal A1 and a least significant bit of the weight value W1j may have a lowest bit order, and the remaining first operation results may be deduced by analogy.

The sense amplifier 120 is coupled to the memory cell array 110. When the in-memory computation device 100 executes an operation, the sense amplifier 120 may receive the first operation results generated by the memory cell array 110, and adds the first operation results to generate a second operation result according to the bit orders corresponding to the first operation results.

In terms of operational details, the word line driver 140 may activate the one or more word lines corresponding to the memory cell block CAj when the in-memory computation device 100 executes a multiply-add operation. The input buffer 130 may provide multiple bits of an input signal (for example, the input signal A1) to the bit lines. In this way, the multiple bits of the weight values W1j to Wnj stored in the memory cell block CAj may be multiplied by the multiple bits of the input signal A1 and generate the multiple first operation results. Concurrently, the sense amplifier 120 may receive and sense the first operation results generated by the memory cell array 110. The sense amplifier 120 enables the addition of the first operation results to generate the second operation result according to the bit orders corresponding to the first operation results.

Figure 2:
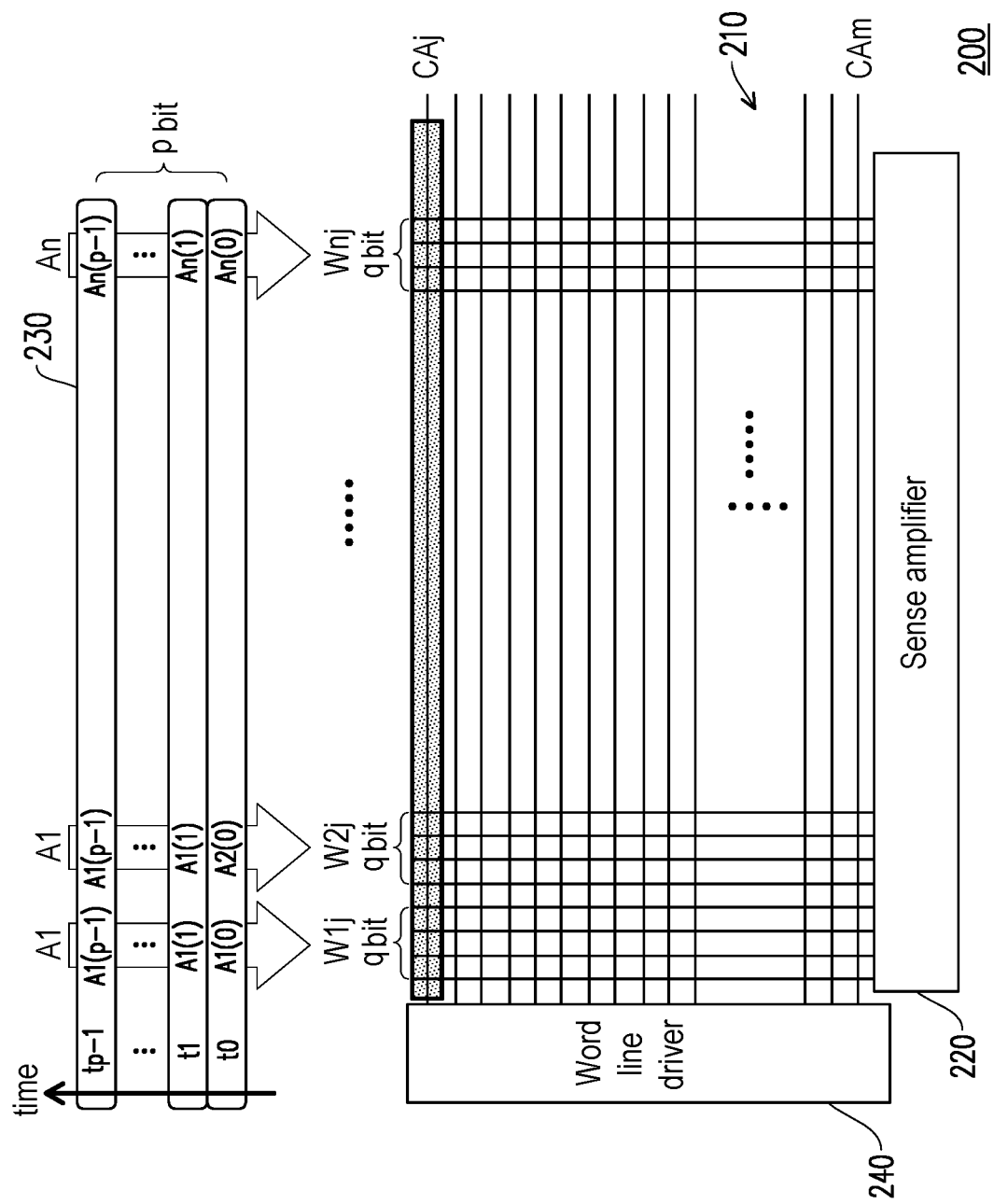
FIG. 2 is a schematic diagram of an in-memory computation device according to another embodiment of the disclosure.

With reference to FIG. 2, FIG. 2 is a schematic diagram of an in-memory computation device according to another embodiment of the disclosure. An in-memory computation device 200 includes a memory cell array 210, an input buffer 230, a sense amplifier 220, and a word line driver 240. There are the multiple memory cell blocks CAj to Cam in the memory cell array 210. Taking the memory cell block CAj as an example, the weight values W1j to Wnj are stored in the memory cell block CAj. Each of the weight values W1j to Wnj may have q bits, and q is a positive integer.

The input signals A1 to An are stored in the input buffer 230. Each of the input signals A1 to An has p bits, and p is a positive integer. During an operation, the input buffer 230 may transmit the multiple bits of the input signals A1 to An to multiple corresponding bit lines in a time-sharing manner. Specifically, the input buffer 230 may transmit least significant bits A1(0) to An(0) of the input signals A1 to An to the corresponding bit lines at a time point t0, transmit second bits A1(1) to An(1) of the input signals A1 to An to the corresponding bit lines at a time t1, . . . , and transmit most significant bits A1(p-1) to An(p-1) of the input signals A1 to An to the corresponding bit lines at a time tp-1.

In the embodiment, based on the weight value W1j having the q bits, memory cells on q corresponding bit lines in the memory cell block CAj are respectively configured to store data of the q bits of the weight value W1j. Here, a number of the corresponding bit lines of the weight value W1j is equal to a bit number of the weight value W1j. In addition, the multiple bits A1(0) to A1(p-1) of the input signal A1 may be transmitted to the q corresponding bit lines in a time-sharing manner.

From the above description, it can be seen that the memory cell array 210 may receive the multiple bits A1(0) to A1(p-1), . . . , An(0) to An(p-1) in the time-sharing manner, and enable a multiplication operation of the input signals A1 to An and the weight values W1j to Wnj to generate the multiple first operation results. The sense amplifier 220 may execute the addition operation according to the bit orders of the first operation results and generate the second operation result.

Figure 3:
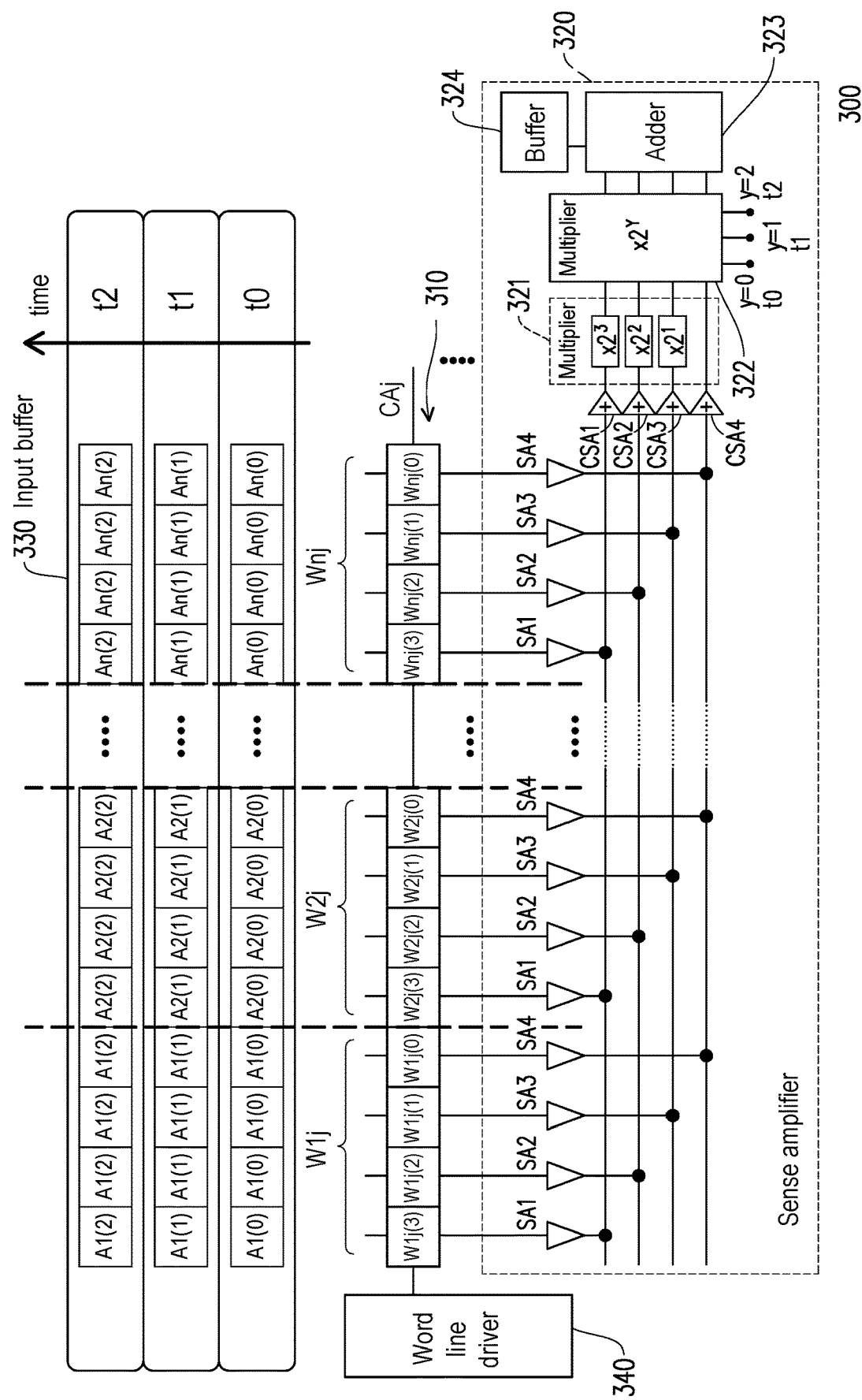
FIG. 3 is a schematic diagram of an implementation corresponding to the in-memory computation device of the embodiment in FIG. 2 of the disclosure.

With reference to FIG. 3, FIG. 3 is a schematic diagram of an implementation corresponding to the in-memory computation device of the embodiment in FIG. 2 of the disclosure. An in-memory computation device 300 includes a memory cell array 310, a sense amplifier 320, an input buffer 330, and a word line driver 340. In FIG. 3, all of the input signals A1 to An have the three bits A1(0) to An(2), and they are stored in the input buffer 330. The first bits A1(0) to An(0) of the input signals A1 to An correspond to the time t0, the second bits A1(1) to An(1) of the input signals A1 to An correspond to the time t1, and the third bits A1(2) to An(2) of the input signals A1 to An correspond to a time t2. In addition, in the memory cell block CAj, each of the weight values W1j to Wnj has four bits W1j(0) to W1j(3), . . . , Wnj(0) to Wnj(3). Therefore, in the memory cell array 310, each of the weight values W1j to Wnj corresponds to four bit lines. In addition, each of the bits A1(0) to An(2) of the input signals A1 to An in the input buffer 330 may also be duplicated to become four copies, so as to be respectively transmitted to the four corresponding bit lines.

In the embodiment, the sense amplifier 320 includes multiple sensing circuits SA1 to SA4 and CSA1 to CSA4, multiple first multipliers 321, a second multiplier 322, an adder 323, and a buffer 324. In the embodiment, the sensing circuit SA1 is coupled to the corresponding bit line of the fourth bits W1j(3) to Wnj(3) of the weight values W1j to Wnj, the sensing circuit SA2 is coupled to the corresponding bit line of the third bits W1j(2) to Wnj(2) of the weight values W1j to Wnj, the sensing circuit SA3 is coupled to the corresponding bit line of the second bits W1j(1) to Wnj(1) of the weight values W1j to Wnj, and the sensing circuit SA4 is coupled to the corresponding bit line of the first bit W1j(0) to Wnj(0) of the weight values W1j to Wnj. The sensing circuits SA1 to SA4 may be configured to sense a current value or a current discharge rate on the corresponding bit line. In addition, the sensing circuits CSA1 to CSA4 are respectively coupled to the sensing circuits SA1 to SA4. Taking the sensing circuits CSA1 as an example, the sensing circuits CSA1 is configured to accumulate the current values or the current discharge rates on the corresponding bit lines sensed by the multiple sensing circuits SA1, so as to sense the first operation results generated by the memory cell block CAj. The sensing circuits CSA1 to CSA4 may be analog current sensing circuits.

In the embodiment, the multiple sensing circuits SA1 are coupled to the corresponding bit lines of a same fourth bit order, the multiple sensing circuits SA2 are coupled to the corresponding bit lines of a same third bit order, the multiple sensing circuits SA3 are coupled to the corresponding bit lines of a same second bit order, and the multiple sensing circuits SA4 are coupled to the corresponding bit lines of a same first bit order.

The first multipliers 321 are respectively coupled to the sensing circuits CSA1 to CSA4, and enable an output of the sensing circuit CSA1 to be multiplied by 2 to the power of 3, enable an output of the sensing circuit CSA2 to be multiplied by 2 to the power of 2; and enable an output of the sensing circuit CSA3 to be multiplied by 2 to the power of 1. The first multiplier 321 is configured to generate multiple first signals. The second multiplier 322 is coupled to the first multipliers. The second multiplier 322 enables multiplication of the first signals and 2 to y-th power to generate multiple second signals, where y is determined according to a time sequence of transmission of each of the bits A1(0) to An(2) of each of the input signals A1 to An, and y is an integer greater than or equal to 0. In detail, at the time t0, y=0; at the time t1, y=1; and at the time t2, y=2. The second multiplier 322 is configured to generate the multiple second signals.

The adder 323 is coupled to the second multiplier 322 and is configured to enable addition of the multiple second signals to generate the second operation result. Here, the second operation result is a multiply-add operation result of the in-memory computation device 300.

Incidentally, the buffer 324 may be coupled to the adder 323 and may serve as a medium for temporarily storing the second operation result.

Figure 4:
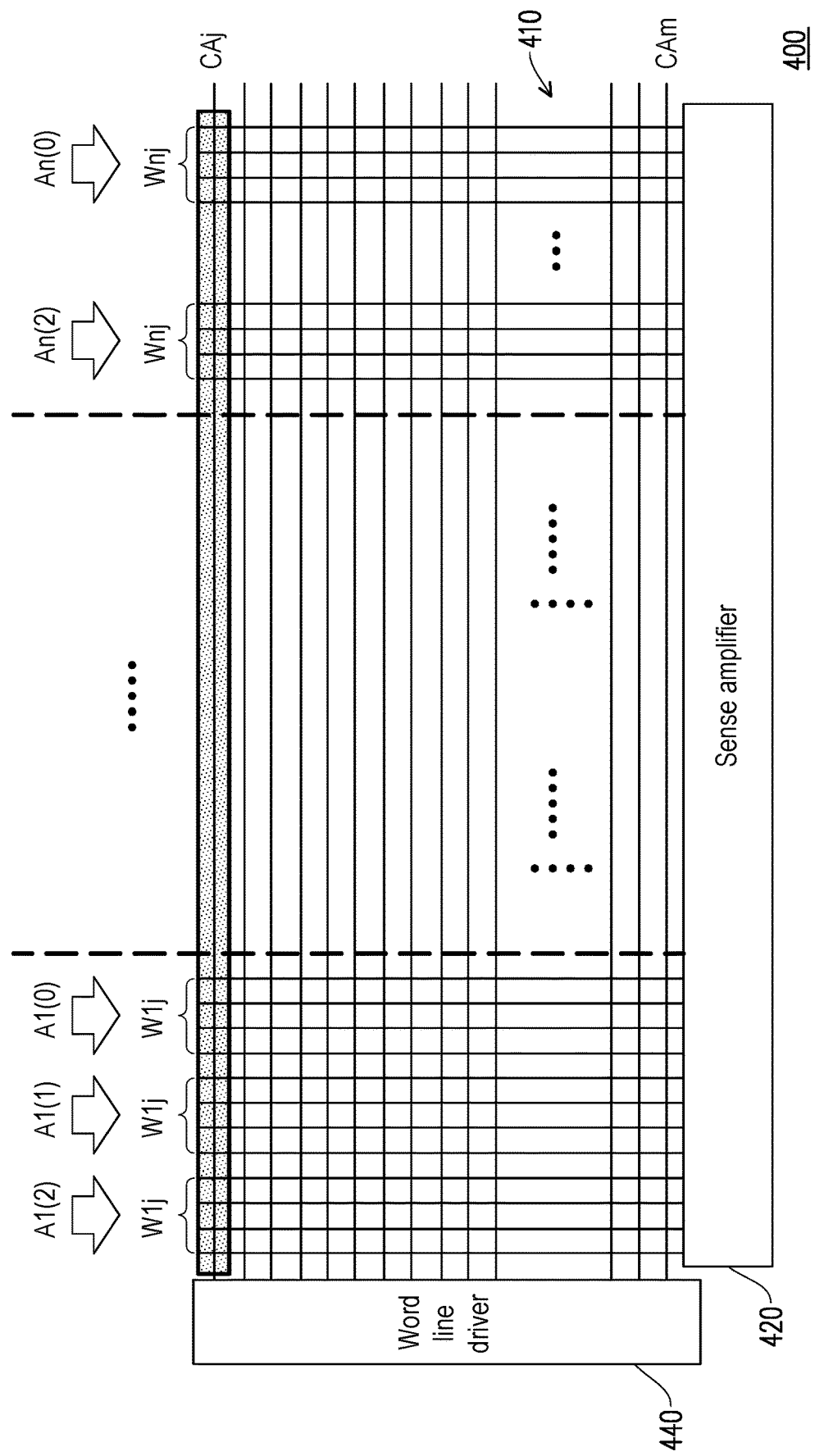
FIG. 4 is a schematic diagram of an in-memory computation device according to another embodiment of the disclosure.

With reference to FIG. 4, FIG. 4 is a schematic diagram of an in-memory computation device according to another embodiment of the disclosure. An in-memory computation device 400 includes a memory cell array 410, a sense amplifier 420, and a word line driver 440. There are the multiple memory cell blocks CAj to CAm in the memory cell array 410. Taking the memory cell block CAj as an example, the weight values W1j to Wnj are stored in the memory cell block CAj, and each of the weight values W1j to Wnj may have multiple bits.

In the embodiment, the input signals A1 to An are provided by an input buffer (not shown), and all of the input signals A1 to An may have multiple bits. The input buffer enables the multiple bits of each of the input signals A1 to An to be transmitted in parallel to the multiple corresponding bit lines. Taking each of the input signals A1 to An all having three bits as an example, the input buffer of the embodiment enables the input signals A1(0), A1(1), and A1(2) to be simultaneously transmitted to the multiple corresponding bit lines of the weight value W1j, and enables the input signals An(0), An(1), and An(2) to be simultaneously transmitted to the multiple corresponding bit lines of the weight value Wnj.

Compared with the embodiment in FIG. 2, this embodiment does not use transmit the multiple bits of the input signal to the corresponding bit lines in a time-sharing manner, but transmits the multiple bits of the input signal to the multiple corresponding bits lines in parallel, which can effectively save operation time. In the embodiment, the multiple bits of the weight values W1j to Wnj may be duplicated to become multiple copies of duplicated weight values, and the multiple copies of the duplicated weight values are enabled to be written to the memory cell block CAj. In the embodiment, the weight values W1j to Wnj may respectively be duplicated to become three copies of the weight values.

Figure 5:
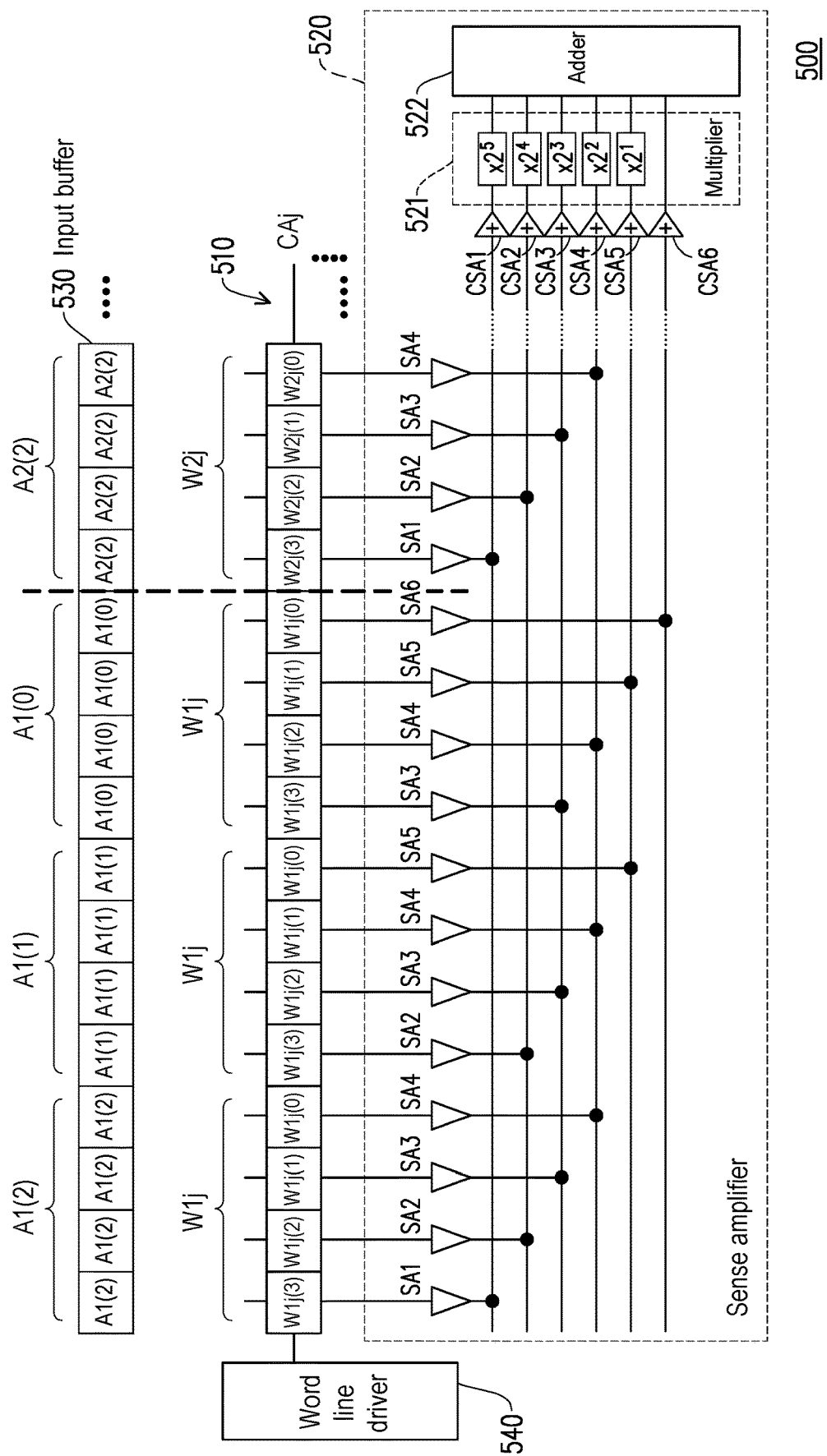
FIG. 5 is a schematic diagram of an implementation corresponding to the in-memory computation device of the embodiment in FIG. 4 of the disclosure.

With reference to FIG. 5, FIG. 5 is a schematic diagram of an implementation corresponding to the in-memory computation device of the embodiment in FIG. 4 of the disclosure. An in-memory computation device 500 includes a memory cell array 510, a sense amplifier 520, an input buffer 530, and a word line driver 540. In the embodiment, the input buffer 530 enables the multiple bits A1(2) to A1(0), and A2(2) of the input signals A1 and A2 to be transmitted to the multiple corresponding bit lines in parallel.

The memory cell block CAj in the memory cell array 510 is configured to store multiple bits W1j(0) to W1j(3), . . . , and W2j(0) to W2j(3) of the weight values W1j to W2j. In the embodiment, taking the input signal A1 as an example, corresponding to the multiple bits A1(2) to A1(0) of the input signal A1, the weight value W1j may be duplicated to become three copies (corresponding to the input signal A1 with the three bits), and are stored in the memory cell block CAj.

In the embodiment, all of the bits A1(2) to A1(0) and A2(2) of the input signals A1 and A2 may be one-time inputted to the memory cell block CAj to execute the multiplication operation.

In addition, the sense amplifier 520 includes multiple sensing circuits SA1 to SA6 and CSA1 to CSA6, a multiplier 521, and an adder 522. The sensing circuits SA1 to SA6 are respectively coupled to corresponding bit lines in different bit orders, and are configured to sense the current values or the current discharge rates on the corresponding bit lines. The sensing circuits CSA1 to CSA6 are respectively coupled to the sensing circuits SA1 to SA6. Taking the sensing circuit CSA1 as an example, the sensing circuit CSA1 is configured to accumulate the current values or the current discharge rates on the corresponding bit lines sensed by the multiple sensing circuits SA1, so as to sense the first operation result generated by the memory cell block CAj. The sensing circuits CSA1 to CSA6 may be analog current sensing circuits.

The multiplier 521 is respectively coupled to output terminals of the sensing circuits CSA1 to CSA5, and enables the output of the sensing circuit CSA1 to be multiplied by 2 to the power of 5, enables the output of the sensing circuit CSA2 to be multiplied by 2 to the power of 4, enables the output of the sensing circuit CSA3 to be multiplied by 2 to the power of 3, enable the output of the sensing circuit CSA4 to be multiplied by 2 to the power of 2, and enable the output of the sensing circuit CSA5 to be multiplied by 2 to the power of 1. The multiplier 521 is configured to generate the multiple first signals.

The adder 522 is coupled to the first multiplier 521. The adder 522 adds the first signals generated by the first multiplier 521 to generate the second operation result.

Figure 6:
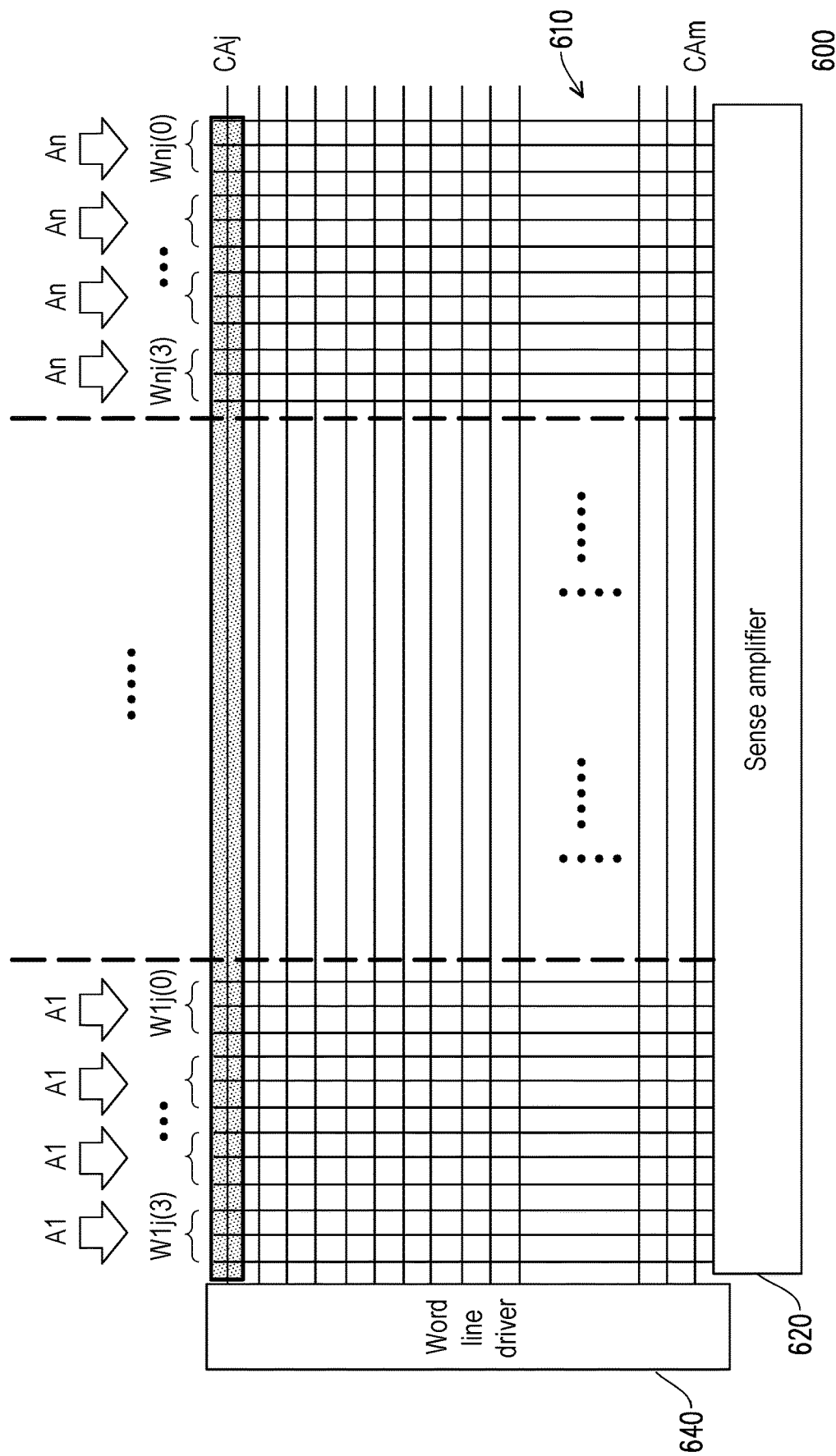
FIG. 6 is a schematic diagram of an in-memory computation device according to another embodiment of the disclosure.

With reference to FIG. 6, FIG. 6 is a schematic diagram of an in-memory computation device according to another embodiment of the disclosure. An in-memory computation device 600 includes a memory cell array 610, a sense amplifier 620, and a word line driver 640. There are the multiple memory cell blocks CAj to CAm in the memory cell array 610. Different from the embodiment in FIG. 4, in the embodiment, the weight values W1j to Wnj stored in the memory cell block CAj are arranged according to the bit order of each bit of the weight values W1j to Wnj. In detail, taking the weight value W1j as an example, same copies of the weight value W1j have multiple bits W1j(0) to W1j(3) of the weight value W1j. The multiple weight values W1j bits W1j(0) are stored in multiple adjacent first corresponding bit lines; the multiple weight values W1j bits W1j(1) are stored in multiple adjacent second corresponding bit lines, the multiple weight values W1j bits W1j(2) are stored in multiple adjacent third corresponding bit line, and the multiple weight values W1j bits W1j(3) are stored in multiple adjacent fourth corresponding bit lines.

Figure 7:
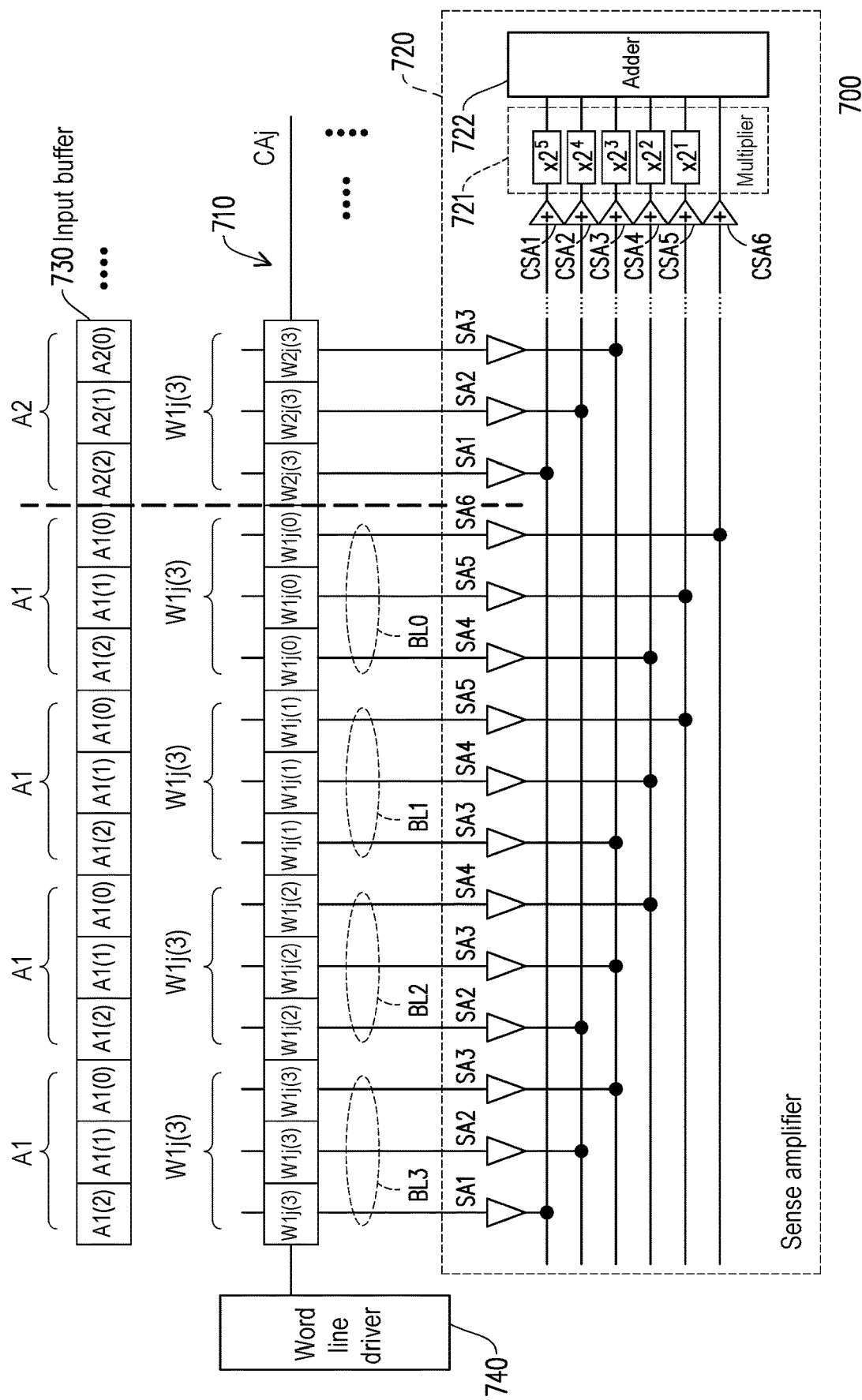
FIG. 7 is a schematic diagram of an implementation corresponding to the in-memory computation device of the embodiment in FIG. 6 of the disclosure.

Reference may be made to FIG. 7 for implementation details, which is a schematic diagram of an implementation corresponding to the in-memory computation device of the embodiment in FIG. 6 of the disclosure. An in-memory computation device 700 includes a memory cell array 710, a sense amplifier 720, an input buffer 730, and a word line driver 740. The memory cell array 710 has a memory cell block CAj. In the memory cell block CAj, memory cells of adjacent corresponding bit lines are configured to store the multiple bits of the weight value W1j in the same bit order. In the embodiment, all memory cells on multiple bit lines BL3 store the bits W1j(3) of the weight value W1j, all memory cells on multiple bit lines BL2 store the bits W1j(2) of the weight value W1j, all memory cells on multiple bit lines BL1 store the bits W1j(1) of the weight value W1j and all memory cells on multiple bit lines BL0 store the bit W1j(0) of the weight value W1j.

The input buffer 730 provides the input signals A1 and A2 to the memory cell block CAj. In detail, taking the input signal A1 as an example, the input buffer 730 may store multiple copies of the input signal A1, and provide the multiple bits A1(3) to A1(0) of the input signal A1 to the corresponding bit line BL3, provide the multiple bits A1(3) to A1(0) of the input signal A1 to the corresponding bit line BL2, provide the multiple bits A1(3) to A1(0) of the input signal A1 to the corresponding bit line BL1, and provide the multiple bits A1(3) to A1(0) of the input signal A1 to the corresponding bit line BL0 according to the bit order of each of the duplicated input signals A1.

The sense amplifier 720 includes the sensing circuits SA1 to SA6 and CSA1 to CSA6, a multiplier 721, and an adder 722. The sensing circuits SA1 to SA6 are configured to sense the current value or the current discharge rate on the corresponding bit line. In the embodiment, output terminals of the sensing circuits SA1 to SA6 are respectively coupled to the sensing circuits CSA1 to CSA6. The sensing circuits CSA1 to CSA6 are configured to respectively accumulate the current values or the current discharge rates on the corresponding bit lines sensed by the multiple sensing circuits SA1 to SA6, so as to sense the first operation results generated by the memory cell block CAj. The sensing circuits CSA1 to CSA6 may be analog current sensing circuits.

The multiplier 721 is coupled to the output terminals of the sensing circuits CSA1 to CSA5, and enables the output of the sensing circuit CSA1 to be multiplied by 2 to the power of 5, enables the output of the sensing circuit CSA2 to be multiplied by 2 to the power of 4, enables the output of the sensing circuit CSA3 to be multiplied by 2 to the power of 3, enables the output of the sensing circuit CSA4 to be multiplied by 2 to the power of 2, enables the output of the sensing circuit CSA5 to be multiplied by 2 to the power of 1. The multiplier 721 is configured to generate the multiple first signals. The adder 722 is coupled to the multiplier 721, and is configured to enable addition of the first signals to generate the second operation result. Here, the second operation result is a multiply-add operation result of the in-memory computation device 700.

Figure 8:
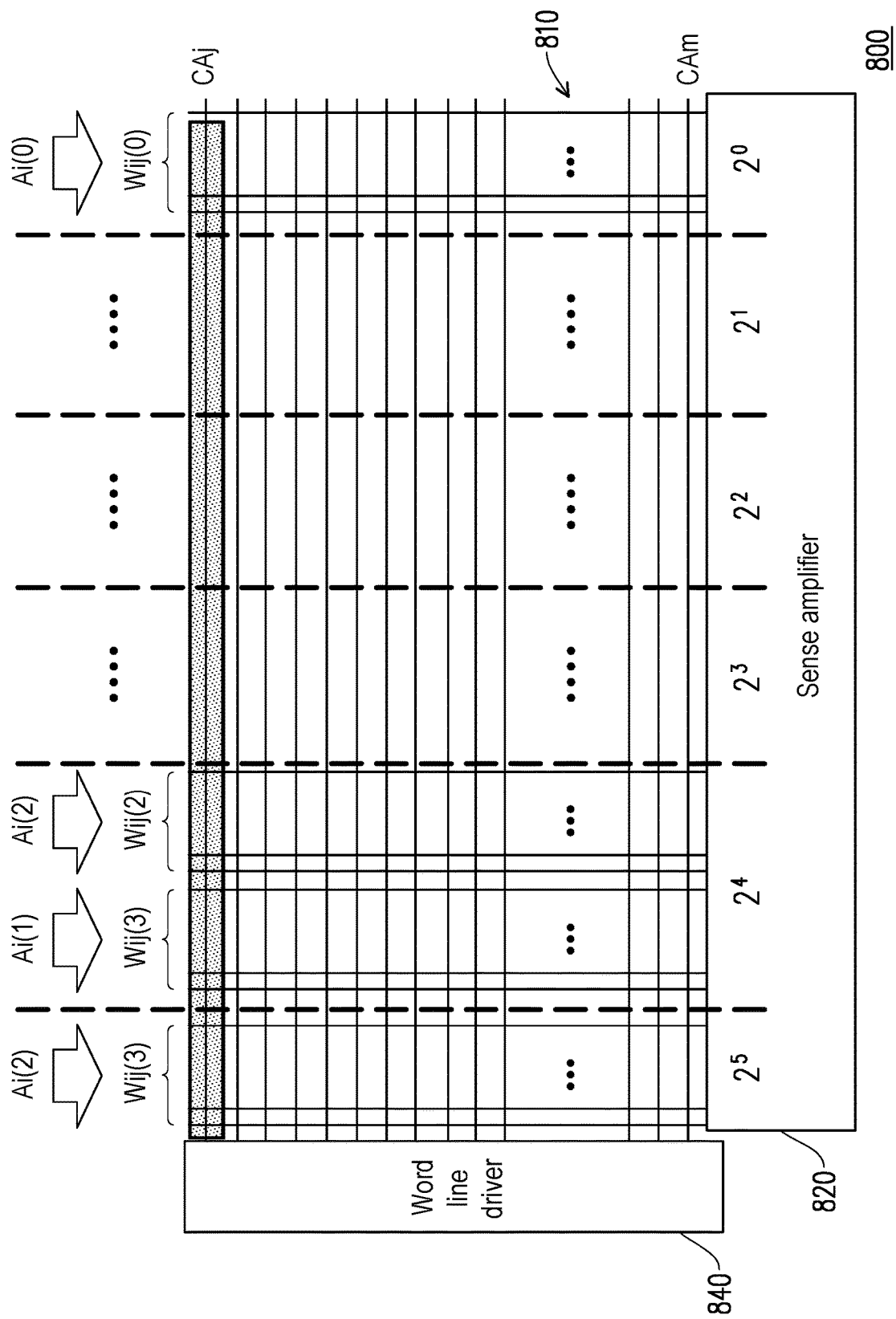
FIG. 8 is a schematic diagram of an in-memory computation device according to another embodiment of the disclosure.

Next, with reference to FIG. 8, FIG. 8 is a schematic diagram of an in-memory computation device according to another embodiment of the disclosure. An in-memory computation device 800 includes a memory cell array 810, a sense amplifier 820, and a word line driver 840. There are the memory cell blocks CAj to Cam in the memory cell array 810. Taking the memory cell block CAj as an example, the memory cell block CAj and the input buffer (not shown) may set a corresponding arrangement relationship of multiple bits W1j(0) to W1j(3) of a weight value and multiple bits A1(0) to A1(2) of an input signal according to the bit order of the first operation result generated during the multiplication operation. In detail, multiplying the bit A1(2) of the input signal by the bit W1j(3) of the weight value may generate a most significant bit of the first operation result, therefore correspondingly set in a field of $2^5$. Multiplying the bit A1(1) of the input signal by the bit W1j(3) of the weight value, and multiplying the bit A1(2) of the input signal by the bit W1j(2) of the weight value, may both generate a second highest bit of the first operation result, therefore correspondingly set in a field of $2^4$. However, multiplying the bit A1(0) of the input signal by the bit W1j(0) of the weight value generates a least significant bit of the first operation result, therefore correspondingly set in a field of $2^0$. Setting of other fields ($2^4$ to $2^1$) may be deduced by analogy according to the above principle.

Figure 9:
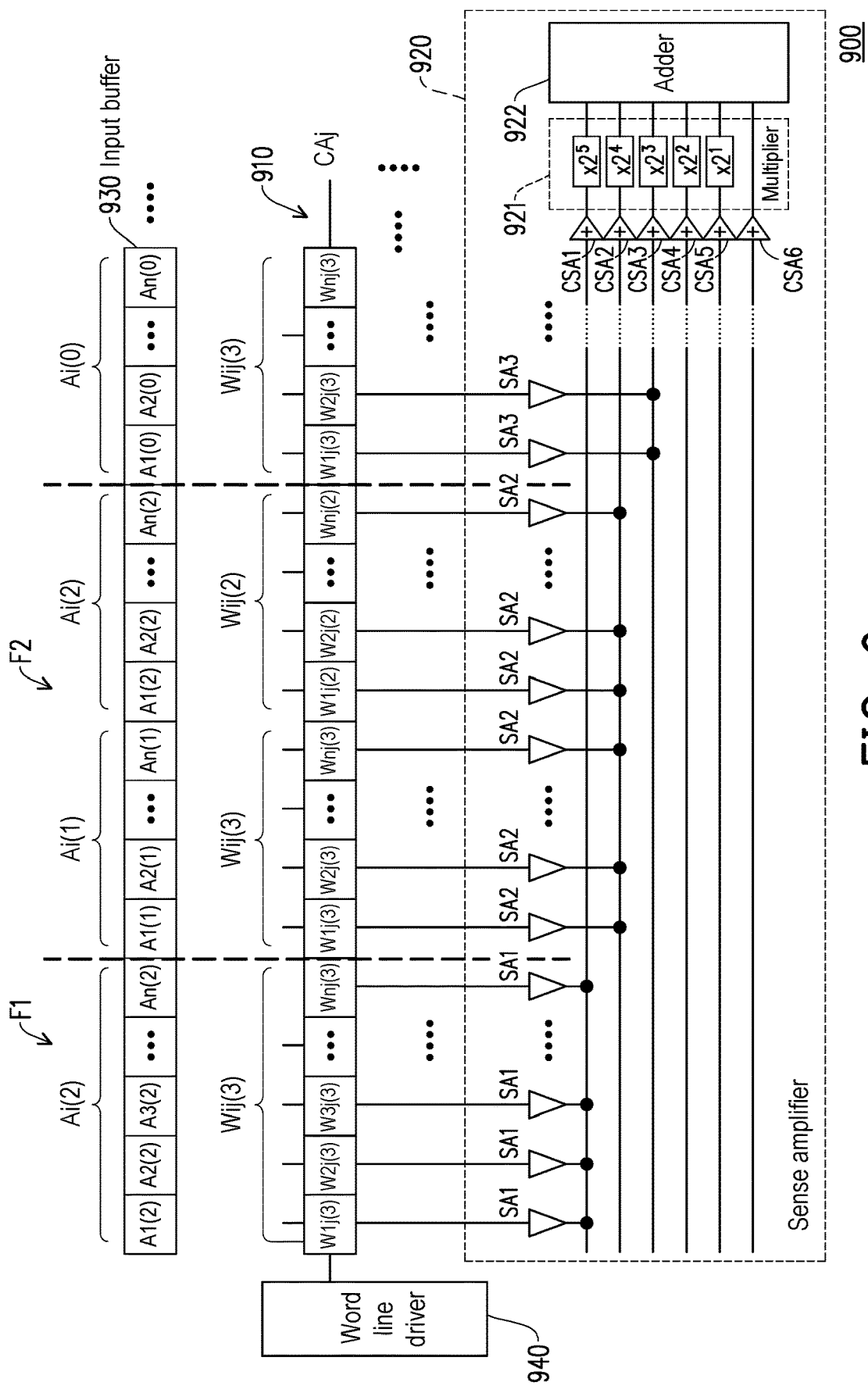
FIG. 9 is a schematic diagram of an implementation corresponding to the in-memory computation device of the embodiment in FIG. 8 of the disclosure.

With reference to FIG. 9, FIG. 9 is a schematic diagram of an implementation corresponding to the in-memory computation device of the embodiment in FIG. 8 of the disclosure. An in-memory computation device 900 includes a memory cell array 910, a sense amplifier 920, an input buffer 930, and a word line driver 940. There is the memory cell block CAj in the memory cell array 910. The memory cell block CAj stores the most significant bit W1j(3) of the weight value in a first field F1. Correspondingly, the input buffer 930 provides the most significant bit A1(2) of the input signal in the first field F1. The memory cell block CAj stores the most significant bit W1j(3) and the second most significant bit W1j(2) of the weight value in a second field F2. Correspondingly, the input buffer 930 provides the bits A1(1) and A1(2) of the input signal in the second field F2. The bits A1(1) and A1(2) of the input signal respectively correspond to the bits W1j(3) and W1j(2) of the weight value.

In the first field F1, a multiplication result of the bit A1(2) of the input signal and the bit W1j(3) of the weight value may generate a most significant bit of the first operation result. In the second field F2, a multiplication result of the bit A1(1) of the input signal and the bit W1j(3) of the weight value, and a multiplication result of the bit A1(2) of the input signal and the bit W1j(2) of the weight value may generate the second most significant bit of the first operation result, and the remaining fields may be deduced by analogy.

The sense amplifier 920 includes the sensing circuits SA1 to SA3 and CSA1 to CSA6, a multiplier 921, and an adder 922. The sensing circuits SA1 are all disposed in the first field F1, the sensing circuits SA2 are all disposed in the second field F2, and the rest may be deduced by analogy. The sensing circuits SA1 to SA3 are configured to sense the current value or the current discharge rate on the corresponding bit line. The sensing circuits CSA1 to CSA6 are configured to respectively accumulate the current values or the current discharge rates on the corresponding bit lines sensed by the multiple sensing circuits SA1 to SA3, so as to sense the first operation results generated by the memory cell block CAj. The multiplier 921 is coupled to the output terminals of the sensing circuit CSA1 to CSA5, and enables the output of the sensing circuit CSA1 to be multiplied by 2 to the power of 5, enables the output of the sensing circuit CSA2 to be multiplied by 2 to the power of 4, enables the output of the sensing circuit CSA3 to be multiplied by 2 to the power of 3, enable the output of the sensing circuit CSA4 to be multiplied by 2 to the power of 2, and enable the output of the sensing circuit CSA5 to be multiplied by 2 to the power of 1. The multiplier 921 is configured to generate the multiple first signals. The adder 922 is coupled to the multiplier 921, and is configured to enable addition of the multiple first signals to generate the second operation result. Here, the second operation result is a multiply-add operation result of the in-memory computation device 900.

Figure 10:
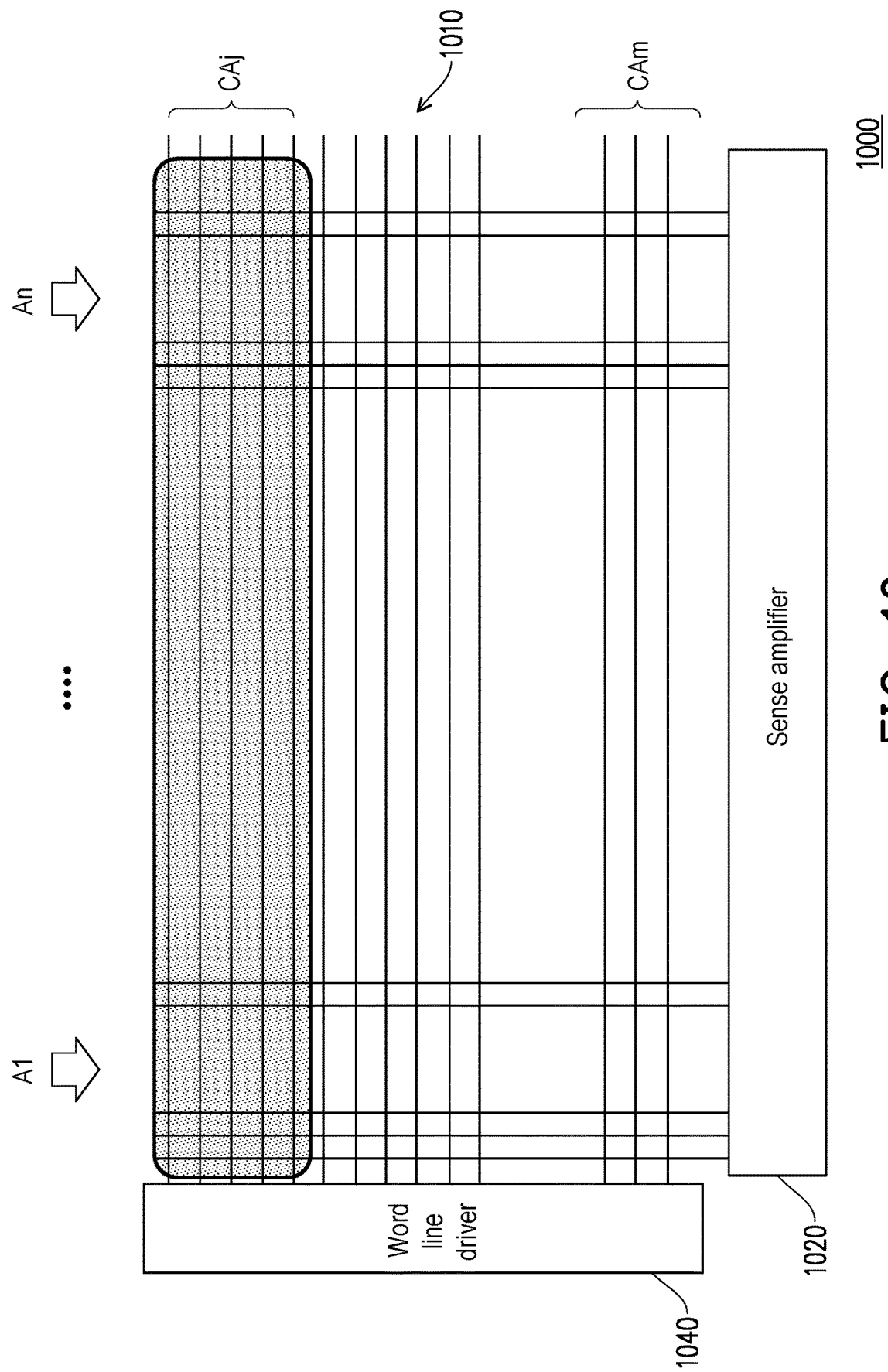
FIG. 10 is a schematic diagram of an in-memory computation device according to another embodiment of the disclosure.

With reference to FIG. 10, FIG. 10 is a schematic diagram of an in-memory computation device according to another embodiment of the disclosure. An in-memory computation device 1000 includes a memory cell array 1010, a sense amplifier 1020, and a word line driver 1040. There are the memory cell blocks CAj to CAm in the memory cell array 1010. Taking the memory cell block CAj as an example, the memory cell block CAj has multiple memory columns respectively corresponding to the multiple word lines. The word line driver 1040 may activate the word lines in sequence. The memory cell block CAj is configured to store the multiple bits of the weight value, and an arrangement of the multiple bits of the weight value may be described in detail in the following implementation.

The input buffer (not shown) is configured to provide the multiple bits of the input signals A1 to An to the multiple corresponding bit lines of the memory cell block CAj. The memory cell block CAj may then enable a multiplication operation of the multiple bits of the weight value and the multiple bits of the input signals A1 to An according to the bit lines that are sequentially switched on, and generate the first operation results.

The sense amplifier 1020 is configured to sense the first operation result, and enable the first operation result to execute an addition operation according to the bit order, which may generate the second operation result.

Figure 11:
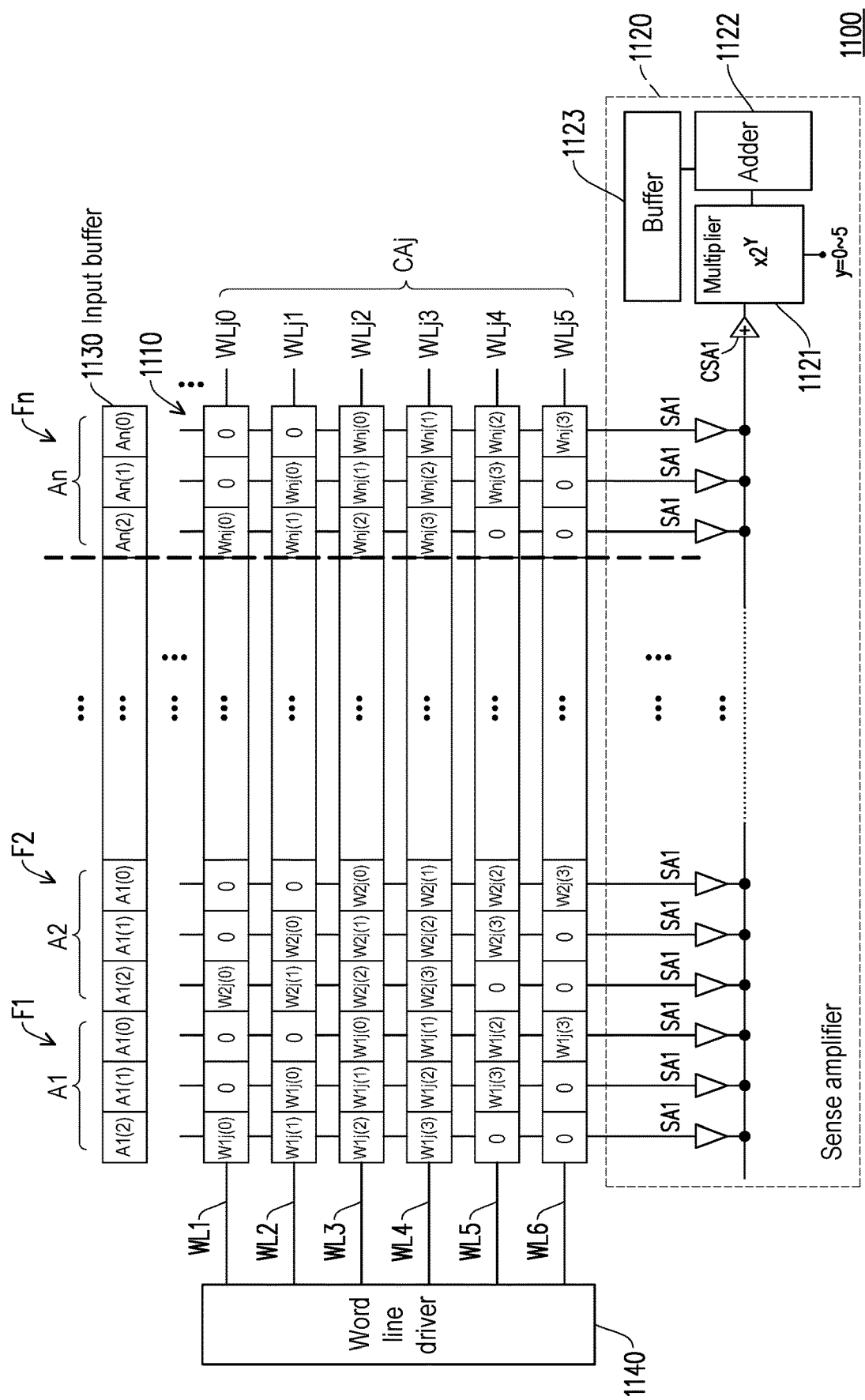
FIG. 11 is a schematic diagram of an implementation corresponding to the in-memory computation device of the embodiment in FIG. 10 of the disclosure.

Next, with reference to FIG. 11, FIG. 11 is a schematic diagram of an implementation corresponding to the in-memory computation device of the embodiment in FIG. 10 of the disclosure. An in-memory computation device 1100 includes a memory cell array 1110, a sense amplifier 1120, an input buffer 1130, and a word line driver 1140. There is the memory cell block CAj in the memory cell array 1110. The memory cell block CAj corresponds to word lines WL1 to WL6. The memory cell block CAj may be divided into multiple fields F1 to Fn, and each of the fields stores the multiple bits $W1j(0)$ to $W1j(3)$, ..., $Wnj(0)$ to $Wnj(3)$ of the weight values $W1j$ to $Wnj$. The multiple fields F1 to Fn respectively correspond to the multiple bits $A1(2)$ to $A1(0)$, ..., $An(2)$ to $An(0)$ of the input signals A1 to An.

For example, in the field F1, the memory cell block CAj store the bit $W1j(0)$ of the weight value in the memory column corresponding to the word line WL1, the memory cell block CAj sequentially stores the two bits $W1j(1)$ and $W1j(0)$ of the weight value in the memory column corresponding to the word line WL2, the memory cell block CAj sequentially stores the three bits $W1j(2)$, $W1j(1)$, and $W1j(0)$ of the weight value in the memory column corresponding to the word line WL3, the memory cell block CAj sequentially stores the three bits $W1j(3)$, $W1j(2)$, and $W1j(1)$ of the weight value in the memory column corresponding to the word line WL4, the memory cell block CAj sequentially stores the two bits $W1j(3)$ and $W1j(2)$ of the weight value in the memory column corresponding to the word line WL5, the memory cell block CAj stores the bit $W1j(3)$ of the weight value in the memory column corresponding to the word line WL6. The memory cell that did not store the weight value stores 0 in the memory cell block CAj.

From the above description, it can be seen that in the same fields F1 to Fn, the memory cell block CAj may store one or more weight value bits $W1j(3)$ to $W1j$ on each of the word line WL1 to WL6. Arrangement of the bits $W1j(3)$ to $W1j(0)$ of the weight value is related to the bit order of an operation result generated after multiplication of the bits $A1(2)$ to $A1(0)$ of the corresponding input signal (taking the input signal A1 as an example).

The sense amplifier 1120 includes the sensing circuits SA1 and CSA1. The sensing circuits SA1 are configured to sense the current value or the current discharge rate on the corresponding bit line. The sensing circuit CSA1 is configured to accumulate the current values or the current discharge rates on the corresponding bit lines sensed by the multiple sensing circuits SA1, so as to sense the first operation result generated by the memory cell block CAj.

It should be noted that since the word lines WL1 to WL6 are activated in a time-sharing manner and based on a special arrangement of the weight values of the embodiment, at a same time, all the current values or the current discharge rates on the corresponding bit lines sensed by the sensing circuits SA1 correspond to a same bit order.

The multiplier 1121 may enable the output of the sensing circuit CSA1 to be multiplied by 2 to the power of y according to the switched-on sequence of the word lines WL1 to WL6, so as to obtain the multiple first signals. In the embodiment, y may sequentially be equal to 0 to 5 when the word lines WL1 to WL6 are sequentially switched on.

The adder 1122 is coupled to the multiplier 1121, and is configured to enable addition of the multiple first signals to generate the second operation result. Here, the second operation result is a multiply-add operation result of the in-memory computation device 1100.

Figure 12:
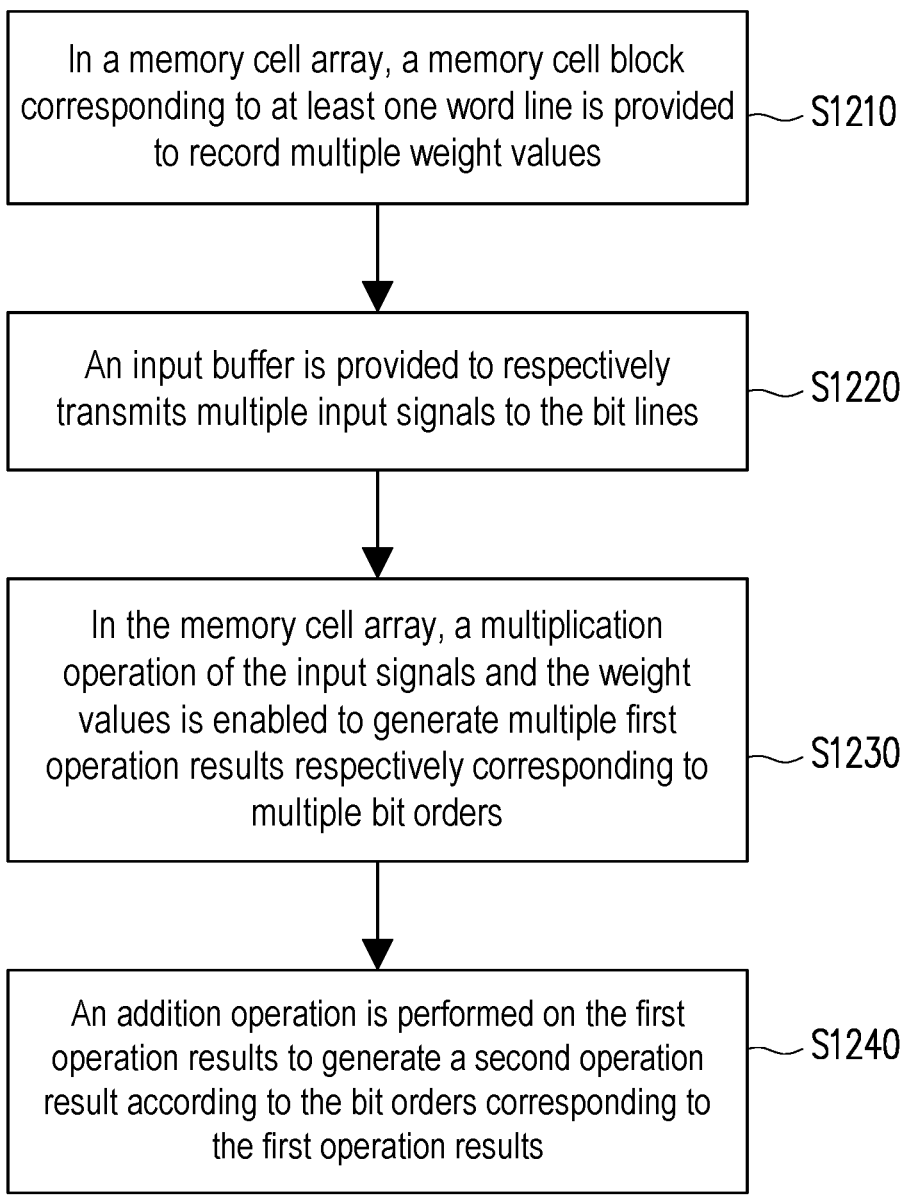
FIG. 12 is a flow chart of an in-memory computation method according to an embodiment of the disclosure.

Please refer to FIG. 12, which is a flow chart of an in-memory computation method according to an embodiment of the disclosure. In a step S1210, in a memory cell array, a memory cell block corresponding to at least one word line is provided to store multiple weight values. In a step S1220, an input buffer is provided to respectively transmits multiple input signals to the bit lines. In a step S1230, in the memory cell array, a multiplication operation of the input signals and the weight values is enabled to generate multiple first operation results respectively corresponding to multiple bit orders. In a step S1240, an addition operation is performed on the first operation results to generate a second operation result according to the bit orders corresponding to the first operation results.

Details of the steps mentioned above have been described in the embodiments mentioned above, and no more repeated description here.

In summary, the in-memory computation device of the disclosure is capable of the operation of multiplying the multiple bits of the weight values and the multiple bits of the input signals two-by-two through utilizing the corresponding relationship of time-sharing and/or spatial configuration between the multiple bits of the weight values stored in the memory cell block and the multiple bits of the input signals. In this way, the hardware structure of the in-memory computation device can be simplified, and the reverse flash memory in the form of a single-level cell can be used to implement the in-memory computation device of the disclosure.

Although the disclosure has been described with reference to the abovementioned embodiments, but it is not intended to limit the disclosure. It is apparent that any one of ordinary skill in the art may make changes and modifications to the described embodiments without departing from the spirit and the scope of the disclosure. Accordingly, the scope of the disclosure is defined by the claims appended hereto and their equivalents in which all terms are meant in their broadest reasonable sense unless otherwise indicated.

What is claimed is:

1. An in-memory computation method, comprising:
providing a memory cell block of a memory cell array to store a plurality of weight values, and providing a plurality of memory cells on the memory cell block to store a plurality of corresponding bits of each of the weight values;
respectively transmitting a plurality of input signals to the plurality of bit lines through an input buffer;
providing the plurality of memory cells to perform a multiplication operation of the plurality of input signals and the plurality of weight values to generate a plurality of first operation results respectively corresponding to a plurality of bit orders; and
performing an addition operation on the plurality of first operation results to generate a second operation result according to the plurality of bit orders by a sense amplifier.

2. The in-memory computation method according to claim 1, wherein a step of respectively transmitting the plurality of input signals to the plurality of bit lines through the input buffer comprises:
providing the input buffer to transmit a plurality of bits of each of the input signals to a plurality of corresponding bit lines in a time-sharing manner.

3. The in-memory computation method according to claim 1, wherein a step of respectively transmitting the plurality of input signals to the plurality of bit lines through the input buffer comprises:
providing the input buffer to transmit a plurality of bits of each of the input signals to a plurality of corresponding bit lines in parallel,
wherein a number of the plurality of corresponding bit lines is equal to multiplication of a bit number of each of the weight values and a bit number of each of the input signals.

4. The in-memory computation method according to claim 3, wherein the plurality of corresponding bit lines in a same bit order corresponding to each of the input signals are adjacently arranged.

5. The in-memory computation method according to claim 3, wherein the plurality of corresponding bit lines are sequentially arranged according to a bit order of the plurality of bits of each of the corresponding input signal.

6. The in-memory computation method according to claim 3, further comprising:
generating an input arrangement sequence according to a bit order of the correspondingly generated plurality of first operation results by the plurality of bits of each of the input signal; and
providing the input buffer to respectively transmit the plurality of bits of each of the input signals to the plurality of corresponding bit lines according to the input arrangement sequence.

7. The in-memory computation method according to claim 3, wherein the memory cell block comprises a plurality of memory columns, and the at least one word line is a plurality of word lines and respectively corresponds to the memory columns, the in-memory computation method further comprises:
providing each of the memory columns to store at least one of the plurality of bits of the plurality of weight values in a field corresponding to each of the input signals.

* * * * *